(12) United States Patent
Farid et al.

(10) Patent No.: US 12,265,765 B2
(45) Date of Patent: *Apr. 1, 2025

(54) METHOD FOR TRAINING AI MODELS TO GENERATE 3D CAD DESIGNS

(71) Applicant: SCINTIUM LTD, Ramat Gan (IL)

(72) Inventors: Maor Farid, Rosh HaAyin (IL); Mordechai Moravia, Rosh HaAyin (IL)

(73) Assignee: SCINTIUM LTD, Ramat Gan (IL)

( * ) Notice: Subject to any disclaimer, the term of this patent is extended or adjusted under 35 U.S.C. 154(b) by 0 days.

This patent is subject to a terminal disclaimer.

(21) Appl. No.: 18/908,028

(22) Filed: Oct. 7, 2024

(65) Prior Publication Data

US 2025/0036836 A1 Jan. 30, 2025

Related U.S. Application Data

(63) Continuation of application No. 18/742,135, filed on Jun. 13, 2024, now Pat. No. 12,164,847, which is a continuation of application No. PCT/IL2024/050514, filed on May 23, 2024.

(60) Provisional application No. 63/468,716, filed on May 24, 2023.

(51) Int. Cl.
G06F 30/27 (2020.01)
G06F 40/20 (2020.01)

(52) U.S. Cl.
CPC .............. *G06F 30/27* (2020.01); *G06F 40/20* (2020.01)

(58) Field of Classification Search
USPC ........................................................... 703/6
See application file for complete search history.

(56) References Cited

U.S. PATENT DOCUMENTS

| | | |
|---|---|---|
| 7,103,434 B2 | 9/2006 | Chernyak et al. |
| 8,780,110 B2 | 7/2014 | Ben Himane et al. |
| 10,102,320 B2 | 10/2018 | Pataky |
| 10,346,768 B2 | 7/2019 | Schnackel |
| 10,950,021 B2 | 3/2021 | Dubey et al. |
| 11,341,627 B2 | 5/2022 | Sarkisian et al. |
| 11,379,630 B2 | 7/2022 | Dweik |
| 11,663,553 B2 | 5/2023 | Stump et al. |
| 11,868,686 B2 | 1/2024 | Kumar et al. |

(Continued)

FOREIGN PATENT DOCUMENTS

| | | |
|---|---|---|
| CN | 115203773 A | 10/2022 |
| KR | 20200063707 A | 6/2020 |

(Continued)

OTHER PUBLICATIONS

Gujarathi, G. P., & Ma, Y.-S. (2011). Parametric CAD/CAE integration using a common data model. Journal of Manufacturing Systems, 30(3), 118-132. doi:10.1016/j.jmsy.2011.01.002.

(Continued)

*Primary Examiner* — Bryce M Aisaka
(74) *Attorney, Agent, or Firm* — The Roy Gross Law Firm, LLC; Roy Gross

(57) ABSTRACT

A computerized method for generating a 3D Computer-Aided Design (CAD) is provided. The method comprising: receiving an input comprising requirements for a new design; processing the input to generate a CAD design using a trained AI model, wherein the CAD design is an assembly of at least two separate components; and outputting the CAD design.

11 Claims, 4 Drawing Sheets

(56) References Cited

U.S. PATENT DOCUMENTS

| | | | |
|---|---|---|---|
| 2017/0343984 A1 | 11/2017 | Czinger et al. | |
| 2018/0033435 A1 | 2/2018 | Jacobs, II | |
| 2018/0315237 A1 | 11/2018 | Byers et al. | |
| 2021/0124855 A1 | 4/2021 | Morczinek et al. | |
| 2021/0267730 A1 | 9/2021 | Azernikov et al. | |
| 2022/0035966 A1* | 2/2022 | McMinn | G06F 30/20 |
| 2022/0405447 A1* | 12/2022 | Musuvathy | B33Y 50/00 |
| 2023/0060989 A1 | 3/2023 | Stoddart et al. | |
| 2023/0061993 A1 | 3/2023 | Nagy et al. | |
| 2023/0145217 A1 | 5/2023 | Harris et al. | |
| 2024/0095077 A1 | 3/2024 | Singh et al. | |

FOREIGN PATENT DOCUMENTS

| | | |
|---|---|---|
| KR | 20200068914 A | 6/2020 |
| KR | 102361118 B1 | 2/2022 |
| KR | 102504720 B1 | 2/2023 |
| WO | 2017122467 A1 | 7/2017 |
| WO | 2021068061 A1 | 4/2021 |
| WO | 2022046329 A1 | 3/2022 |

OTHER PUBLICATIONS

Frank, Gerald & Entner, Doris & Prante, Thorsten & Khachatouri, Vaheh & Schwarz, Martin. (2014). Towards a Generic Framework of Engineering Design Automation for Creating Complex CAD Models. International Journal of Advances in Systems and Measurements. 7. 179-192.

Develop3D (2017), "Review: Frustum Generate 1.4". Oct. 19, 2017. Available online: [https://develop3d.com/reviews/review-frustum-generate-1-4-design-tech-topology-optimisation-cloud/].

Gajek, C., Schiendorfer, A., Reif, W. (2023). A Recommendation System for CAD Assembly Modeling Based on Graph Neural Networks. In: Amini, MR., Canu, S., Fischer, A., Guns, T., Kralj Novak, P., Tsoumakas, G. (eds) Machine Learning and Knowledge Discovery in Databases. ECML PKDD 2022. Lecture Notes in Computer Science( ), vol. 13713. Springer, Cham. Retrieved from the Internet:<URL:https://opus.bibliothek.uni-augsburg.de/opus4/frontdoor/deliver/index/docId/101528/file/ecml_lenzen2022.pdf>.

PCT International Search Report for International Application No. PCT/IL2024/050514, mailed Aug. 25, 2024, 6pp.

PCT Written Opinion for International Application No. PCT/IL2024/050514, mailed Aug. 25, 2024, 7pp.

* cited by examiner

METHOD FOR TRAINING AI MODELS TO GENERATE 3D CAD DESIGNS

CROSS REFERENCE TO RELATED APPLICATIONS

This application is a Continuation of U.S. patent application Ser. No. 18/742,135, filed Jun. 13, 2024, which is a Bypass Continuation of PCT Patent Application No. PCT/IL2024/050514 having International filing date of May 23, 2024, which claims the benefit of priority of U.S. Provisional Patent Application No. 63/468,716, filed May 24, 2023, the contents of which are all incorporated herein by reference in their entirety.

TECHNICAL FIELD

The presently disclosed subject matter relates to generation of a 3D Computer-Aided Design (CAD).

BACKGROUND

Computer-aided design (CAD) has become an essential tool in engineering, architecture, and manufacturing, providing designers and engineers with the ability to create precise and detailed digital models of physical objects, sometimes from scratch, based on a given specification. Traditional CAD systems require extensive and iterative manual input and significant expertise to produce accurate designs. These systems often involve multiple steps, including defining design parameters, creating geometric models, and refining the designs based on iterative feedback.

Hence, despite the widespread use and benefits of CAD systems, the traditional process can be time-consuming and prone to human error. Designers must often manually integrate various types of input data, such as textual descriptions, sketches, and existing CAD models, which can lead to inconsistencies and inefficiencies. Additionally, ensuring that the designs adhere to industry standards and specific organizational requirements often requires substantial expertise and experience. As a result, there is a growing need for more intelligent and automated solutions that can streamline the design process and improve the accuracy of generated designs.

General Description

In addressing the above challenges and with the advancement of technology, it is advantageous, according to certain embodiments of the presently disclosed subject matter, to integrate artificial intelligence (AI) technologies with generation of CAD designs to automate and improve the design process. AI models can be used to assist in interpreting complex design requirements, optimizing design parameters, and generating models that adhere to specific engineering standards. By leveraging AI, it is possible to streamline the creation of CAD models, while reducing the time required for design iterations, and enhancing the overall efficiency of the design process.

According to certain embodiments of the presently disclosed subject matter, there is provided a method for generating a 3D Computer-Aided Design (CAD). The method can receive an input comprising requirements for a new design, where the CAD design is an assembly of several separate components. The method can include processing the input to generate the CAD design using an AI model trained for that purpose. The disclosed subject matter aims to effectively integrating AI techniques into the generation of CAD designs, in real time or near real time. One example of such integration is by use of LLM in processing and combining various modalities of input data, such as textual descriptions, sketches, and existing CAD models, thus, enabling to understand how to extract information from one domain (modality) and apply it to another.

Additionally, usage of AI models trained on industry standards and specific organizational requirements ensures that the generated designs meet these standards and requirements which may be crucial for practical applications. Other advantages of the claimed subject matter achieve designing of products that consist of assemblies of multiple separate components, where each component is integrated with others and performs its intended function.

The trained system according to the presently disclosed subject matter, assists users in generating detailed technical specifications, conceptual designs, 3D CAD models, and automatic drawings for a wide range of applications including industrial devices, construction infrastructures, as well as mechanical and electrical devices. Also, as described further below, the system uses prompt-based inputs of various modalities, and iteratively refines a generated design, based on user feedback, until the design is satisfactory to the user.

According to a first aspect of the presently disclosed subject matter there is provided a computerized method for generating a 3D Computer-Aided Design (CAD), the method comprising:
  receiving an input comprising requirements for a new design;
  processing the input to generate a CAD design using a trained AI model, wherein the CAD design is an assembly of at least two separate components; and
  outputting the CAD design.

In addition to the above features, the computer implemented method according to this aspect of the presently disclosed subject matter can optionally comprise in some examples one or more of features (i) to (xvi) below, in any technically possible combination or permutation:
  (i). Wherein each of the components is selected from a sub-assembly and a part.
  (ii). Wherein the input comprises at least an input modality of a CAD design and requirements pertaining to the CAD design.
  (iii). Wherein the input comprises a plurality of input modalities and requirements pertaining to the input modalities, and prior to processing the input modalities, the method further comprising:
    fusing the input modalities to generate a fused input using Large Language Model (LLM); and
    processing the fused input.
  (iv). Wherein each of the input modalities is selected from a group comprising: a textual description, a sketch, a CAD design, a 2D illustration image, and a technical specification.
  (v). The method further comprising enriching the input with targeted organization-specific data, and processing the enriched input to generate the CAD design.
  (vi). Wherein the targeted organization-specific data comprises an organization's Product Lifecycle Management (PLM) system, including CAD data stored within the PLM system and an organization's documents.
  (vii). Wherein the generated CAD design comprises at least one known component.

(viii). Wherein processing the input further comprises:
  generating an embedding vector corresponding to an ideal component to be included in the CAD design;
  accessing a vector database (Vector DB) storing a plurality of vectors, wherein each vector represents a known component used in designs;
  searching the Vector DB to identify a matching vector to the embedding vector;
  retrieving a known component corresponding to the matching vectors; and
  generating the CAD design using the retrieved known component.
(ix). Wherein at least one of the vectors stored in the Vector DB represents a known component obtained from targeted organization-specific data.
(x). Wherein processing the input further comprises:
  enriching the input based on at least responses to requests for additional information based on pre-trained engineering requirements or data based on responses to user-initiated questions; and
  processing the enriched input to generate the CAD design.
(xi). Wherein the outputted CAD design is compliant with Design for Manufacturing and Automation (DFMA) standards.
(xii). Wherein the outputted CAD design includes technical specification of the CAD design.
(xiii). Wherein the outputted CAD design includes technical specification of at least one subcomponent of the CAD design.
(xiv). The method further comprising:
  repeatedly:
    receiving at least one request for a change to the outputted CAD design;
    processing the modification request to generate a revised CAD design; and
    outputting the revised CAD design.
(xv). Wherein the outputted CAD design comprises at least a blueprint drawing, including at least 2D projections of the CAD design.

The presently disclosed subject matter further comprises a computer system comprising a processing circuitry that comprises at least one processor and a computer memory, the processing circuitry is configured to execute a method as described above with reference to the first aspect and may optionally further comprise one or more of the features (i) to (xv) listed above, mutatis mutandis, in any technically possible combination or permutation.

The presently disclosed subject matter further comprises a non-transitory computer readable storage medium tangibly embodying a program of instructions that, when executed by a computer, cause the computer to perform a method as described above with reference the first aspect, and may optionally further comprise one or more of the features (i) to (xv) listed above, mutatis mutandis, in any technically possible combination or permutation.

According to a second aspect of the presently disclosed subject matter there is provided a computerized method for training an artificial intelligence (AI) model to generate a 3D Computer-Aided Design (CAD), the method comprising:
  obtaining input data comprising at least requirements for a new design; and
  training the AI model to interpret the input data and generate a corresponding CAD design, wherein the CAD design is an assembly of at least two separate components.

In addition to the above features, the method according to this aspect of the presently disclosed subject matter can comprise one or more of features (i) to (vi) listed below, in any desired combination or permutation which is technically possible:
(i). Wherein each of the components is selected from a sub-assembly and a part.
(ii). Wherein the input data comprises at least an input modality of a CAD design and requirements pertaining to the CAD design.
(iii). Wherein the input comprises a plurality of input modalities, wherein the method further comprises:
  prior to training the AI model, preprocessing the plurality of input modalities, using at least a Large Language Model (LLM), by:
    generating embedding vectors for each of the modalities using vector embedding techniques; and
    fusing the embedding vectors in various combinations of the modalities to create linked representations of the input data modalities; and
    training the AI model to interpret the input data and the generated combination.
(iv). Wherein each of the input modalities is selected from a group comprising: a textual description, a sketch, a 2D illustration image, and a technical specification.
(v). Wherein preprocessing the plurality of input modalities comprises training each type of input modality using a designated AI model specifically suited for that modality.
(vi). The method further comprising enriching the input data with targeted organization-specific data.
(vii). Wherein enriching the input comprises integrating data from the organization's Product Lifecycle Management (PLM) system, including CAD data stored within the PLM system and the organization's documents.
(viii). Wherein enriching the input comprises integrating data from the organization's inventory.
(ix). Wherein training the AI model further comprises training the AI model to identify and model the engineering constraints between the different components.
(x). Wherein training the AI model to identify and model the engineering constraints comprises masking some of the components during training and teaching the AI model to predict an appropriate component to place in the masked position.
(xi). Wherein training the AI model further comprises training the AI model to generate a CAD design comprising at least one known component.
(xii). Wherein training the AI model further comprises training the AI model to:
  generate an embedding vector corresponding to an ideal component to be included in the CAD design;
  access a vector database storing a plurality of vectors, wherein each vector represents a known component used in designs;
  search the vector database to identify a matching vector to the embedding vector;
  retrieve a known component corresponding to the matching vectors; and
  generate the CAD design using the retrieved known component.
(xiii). Wherein at least one of the vectors stored in the vector database represents a known component obtained from targeted organization-specific data.

(xiv). The method further comprising:
applying RLHF (Reinforcement Learning Human Feedback) mechanisms to refine the AI model generated CAD designs.

(xv). The method further comprising training the AI model to:
enrich the input based on at least responses to requests for additional information based on pre-trained engineering requirements or data based on responses to user-initiated questions; and
process the enriched input to generate the CAD design.

(xvi). Wherein the AI model is trained to generate a corresponding CAD design compliant with Design for Manufacturing and Automation (DFMA) standards.

(xvii). Wherein the AI model is trained to output technical specification of the outputted CAD design.

The presently disclosed subject matter further comprises a computer system comprising a processing circuitry that comprises at least one processor and a computer memory, the processing circuitry is configured to execute a method as described above with reference the second aspect and may optionally further comprise one or more of the features (i) to (xvii) listed above, mutatis mutandis, in any technically possible combination or permutation.

The presently disclosed subject matter further comprises a non-transitory computer readable storage medium tangibly embodying a program of instructions that, when executed by a computer, cause the computer to perform a method as described above with reference the second aspect, and may optionally further comprise one or more of the features (i) to (xvii) listed above, mutatis mutandis, in any technically possible combination or permutation.

According to a third aspect of the presently disclosed subject matter there is provided a 3D Computer-Aided Design (CAD) model generated by a computerized method, the method comprising:
receiving an input comprising requirements for a new design;
processing the input to generate the CAD design using a trained AI model, wherein the CAD design is an assembly of at least two separate components; and
outputting the CAD design.

The CAD according the third aspect of the presently disclosed subject matter can comprise one or more of the features listed above with respect to the first or the second aspects, in any desired combination or permutation which is technically possible.

BRIEF DESCRIPTION OF THE DRAWINGS

In order to understand the invention and to see how it can be carried out in practice, embodiments will be described, by way of non-limiting examples, with reference to the accompanying drawings, in which.

DETAILED DESCRIPTION

Figure 1:
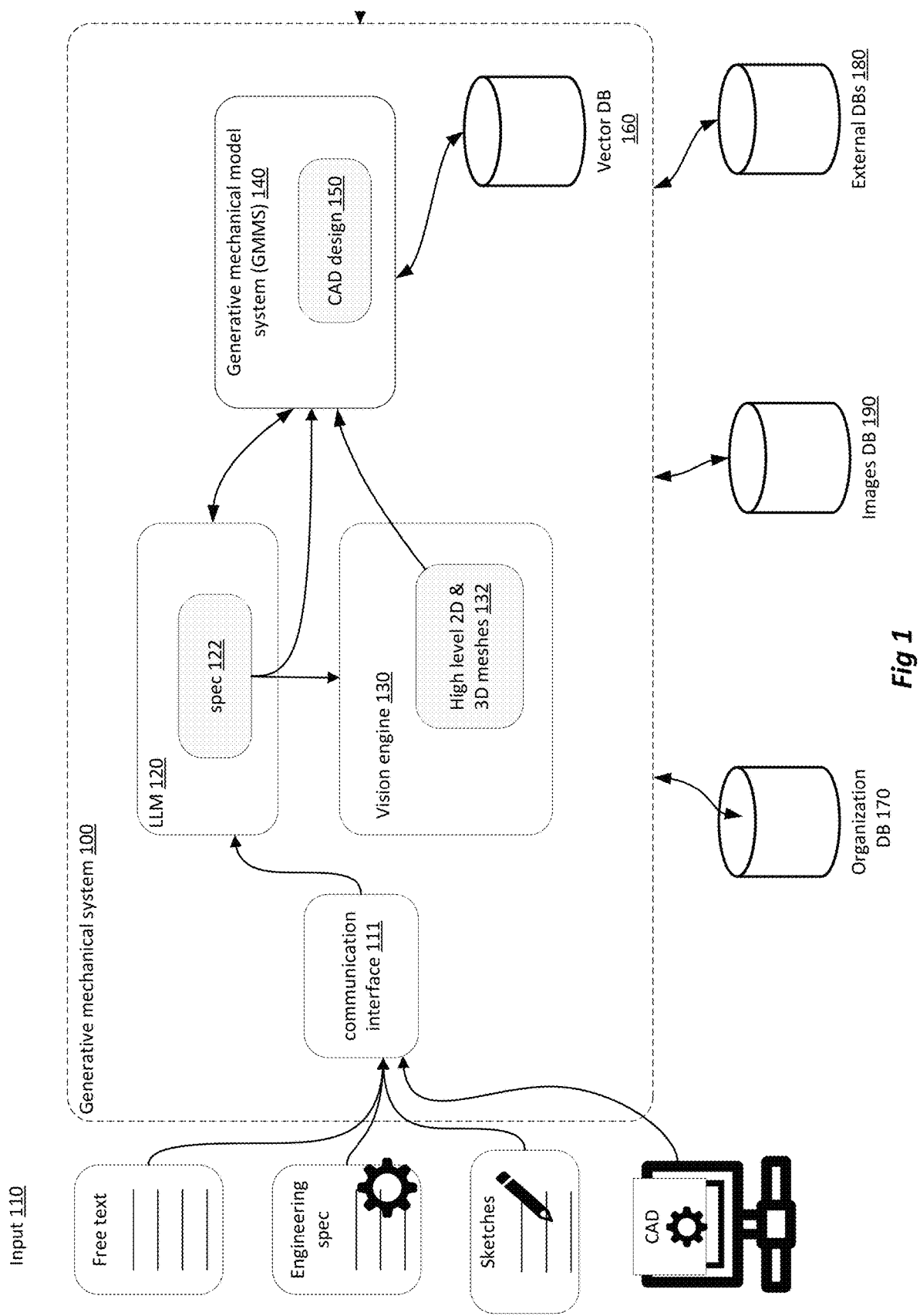
FIG. 1 illustrates a data processing flow according to certain embodiments of the presently disclosed subject matter.

In the following detailed description, numerous specific details are set forth in order to provide a thorough understanding of the invention. However, it will be understood by those skilled in the art that the presently disclosed subject matter may be practiced without these specific details. In other instances, well-known methods, procedures, components, and circuits have not been described in detail so as not to obscure the presently disclosed subject matter.

Unless specifically stated otherwise, as apparent from the following discussions, it is appreciated that throughout the specification discussions utilizing terms such as "receiving," "processing," "outputting," "fusing," "enriching," "generating,", "accessing", "retrieving," "searching,", "masking,", "obtaining", "training", "interpreting", or the like, refer to the action(s) and/or process(es) of a computer that manipulate and/or transform data into other data, said data represented as physical, such as electronic, quantities and/or said data representing physical objects.

The term "computer", "computer system", "computer device", "computerized device", "computerized method" or the like, should be expansively construed to cover any kind of hardware-based electronic device with one or more data processing circuitries. A processing circuitry can comprise, for example, one or more processors operatively connected to computer memory of any suitable sort, loaded with executable instructions for executing operations, as further described below. The one or more processors referred to herein can represent, for example, one or more general-purpose processing devices such as a microprocessor, a central processing unit, or the like. More particularly, a given processor may be one of a complex instruction set computing (CISC) microprocessor, a reduced instruction set computing (RISC) microprocessor, a very long instruction word (VLIW) microprocessor, processor implementing other instruction sets, or a processor implementing a combination of instruction sets. The one or more processors may also be one or more special-purpose processing devices such as an application specific integrated circuit (ASIC), a field programmable gate array (FPGA), a digital signal processor (DSP), a graphics processing unit (GPU), a network processor, or the like. By way of non-limiting example, computerized systems or devices can include the generative mechanical system 100, disclosed in the present application.

The terms "non-transitory memory" and "non-transitory storage medium" used herein should be expansively construed to cover any volatile or non-volatile computer memory suitable to the presently disclosed subject matter.

The operations in accordance with the teachings herein may be performed by a computer specially constructed for the desired purposes or by a general-purpose computer specially configured for the desired purpose by a computer program stored in a non-transitory computer-readable storage medium.

As used herein, phrases including "for example", "such as", "for instance" and variants thereof, describe non-limiting embodiments of the presently disclosed subject matter. Usage of conditional language, such as "may", "might", or variants thereof, should be construed as conveying that one or more examples of the subject matter may include, while one or more other examples of the subject matter may not necessarily include, certain methods, procedures, components, and features. Thus, such conditional language is not generally intended to imply that a particular described method, procedure, component, or circuit is necessarily included in all examples of the subject matter. Moreover, the usage of non-conditional language does not necessarily imply that a particular described method, procedure, component, or circuit is necessarily included in all examples of the subject matter. Also, reference in the specification to "one case", "some cases", "other cases", or variants thereof, means that a particular feature, structure, or characteristic described in connection with the embodiment(s) is included in at least one embodiment of the presently disclosed subject matter. Thus, the appearance of the phrase "one case", "some cases", "other cases", or variants thereof, does not necessarily refer to the same embodiment(s).

It is appreciated that certain features of the presently disclosed subject matter, which are, for clarity, described in the context of separate embodiments, may also be provided in combination in a single embodiment. Conversely, various features of the presently disclosed subject matter, which are, for brevity, described in the context of a single embodiment, may also be provided separately or in any suitable sub-combination.

Bearing this in mind, attention is drawn to FIG. 1, illustrating a data processing flow according to certain embodiments of the presently disclosed subject matter. FIG. 1 enables the generation of a 3D Computer-Aided Design (CAD) based on an input, while using functionality of elements in a generative mechanical system 100 (referred to herein and below as 'system 100'). For clearer illustration only, the system elements are marked in rounded rectangles, whereas the output of each element is grey shaded.

The process may be initiated by a user who wishes to model a design, and insert an input 110 to the system 100. The input 110 can be received by the system 100, e.g. through a communication interface 111. The input can include requirements for a new design. Various input modalities can be received, such as textual description, for example free text inserted by a user, technical specifications such as engineering specifications, sketches, a CAD design, or a 2D illustration image (not illustrated).

The input may be transmitted to a Large Language Model (LLM) 120 comprising one or more LLMs and Deep Learning Models (DLMs) for processing the input to eventually output a spec 122, including a working plan including technical instructions based on the input. For example, the working plan can include an assembly tree indicating which components are required for building the required design, and the order in which these components should be produced. Further details of the spec 122 are described below.

In order to generate the spec 122, the LLM 120 is trained on billions of data sources, including Images, text, and 3D CAD data, and can process each modality using a designated LLM for each. For example, the textual input may be injected into a model trained on trillions of textual words, and later fine-tuned on hundreds of technical books from the domain of mechanical engineering. The image input may be injected into a model trained on billions of images, and later fine-tuned on millions of mechanical engineering-related images. Further details of training the models are described further below with respect to FIG. 4.

The LLM 120 can further fuse the output from each of the LLMs. Fusion of the processed inputs can include fusing different combinations of those inputs, to allow the LLM 120 to extract information from one modality to another. For example, textual instructions input, also known as product requirements or specifications, can be combined with the corresponding 3D CAD data, resulting in a fused spec including technical instructions. Another example is including fusion of input including standard 2D images information with the corresponding 3D CAD data. Further details on training the LLM 120 to fuse separate input modalities in order to understand the relations between the input modalities and generate the fused spec are described further below with respect to FIG. 4. The result of the fused input is the spec 122 in FIG. 1, and is later used for generating the CAD design.

Using LLMs to process different modalities and fusing them into a single spec for the purpose of generating a 3D CAD according to the presently disclosed subject matter, is advantageous, as it enables the generation of a CAD design based on various modalities and their combination.

To illustrate the above, assume a user wishes to model a racing car. The user can input free text describing the desired racing car. Additionally, the user can provide an engineering specification of another racing car and a sketch of the desired design. The user can also add constraints, such as specifying in free text that 360-degree cameras should be integrated and connected to the car. The LLM 120 can process each of the inputs, including the constraints, the sketch input, and the engineering specification input, to generate corresponding outputs, and then fuse them into a single spec 122, representing the working plan for the racing car. For example, the spec 122 can include the following components in this order: a chassis, an engine, wheels, a transmission system, 360-degree cameras, and the necessary electrical systems for connecting the cameras.

The spec 122 can be transmitted to a vision engine 130. The vision engine 130 can process the spec 122, analyse existing images of relevant components stored in images DB 190 or accessible on the web, and generate visual representations based on the input instructions. The vision engine 130 may use a diffusion model trained on a large dataset of images, including 3D models and actual photographs of various engineering components, to produce high-level 2D and 3D meshes that depict how specific components would look. Several versions of a visual design of a component may be generated to show different design possibilities.

These 3D meshes, referred to as 2D & 3D meshes 132 in FIG. 1, are three-dimensional shapes composed of interconnected triangles forming the surface of the required component. These meshes do not include detailed assemblies, but rather shell models, which may later be refined by a generative mechanical model system (GMMS) 140, together with the spec 122, into detailed designs.

In the racing car example, the vision engine 130 receives the spec 122 and is first tasked with creating a 3D model of e.g. the engine. The vision engine 130 can analyze existing images of engines and generate a 3D mesh of the new engine that adheres to the given specification, as detailed in the spec 122, while fitting within the constraints of the racing car's design, such as being narrow, to fit a narrow racing car. For example, it will produce a detailed mesh that represents the engine's shape and structure.

The meshes 132 can then be used, together with the spec 122, by the generative mechanical model system (GMMS) 140 to create a complete CAD model, referred to as a CAD design 150, incorporating all necessary mechanical assemblies and details, ensuring that the design is both functional and manufacturable. The operation of the GMMS 140 and its usage of DBs such as a vector database (Vector DB) 160, Organization DB 170, and External DBs 180, are further described below with respect to FIGS. 3 and 4.

Figure 2:
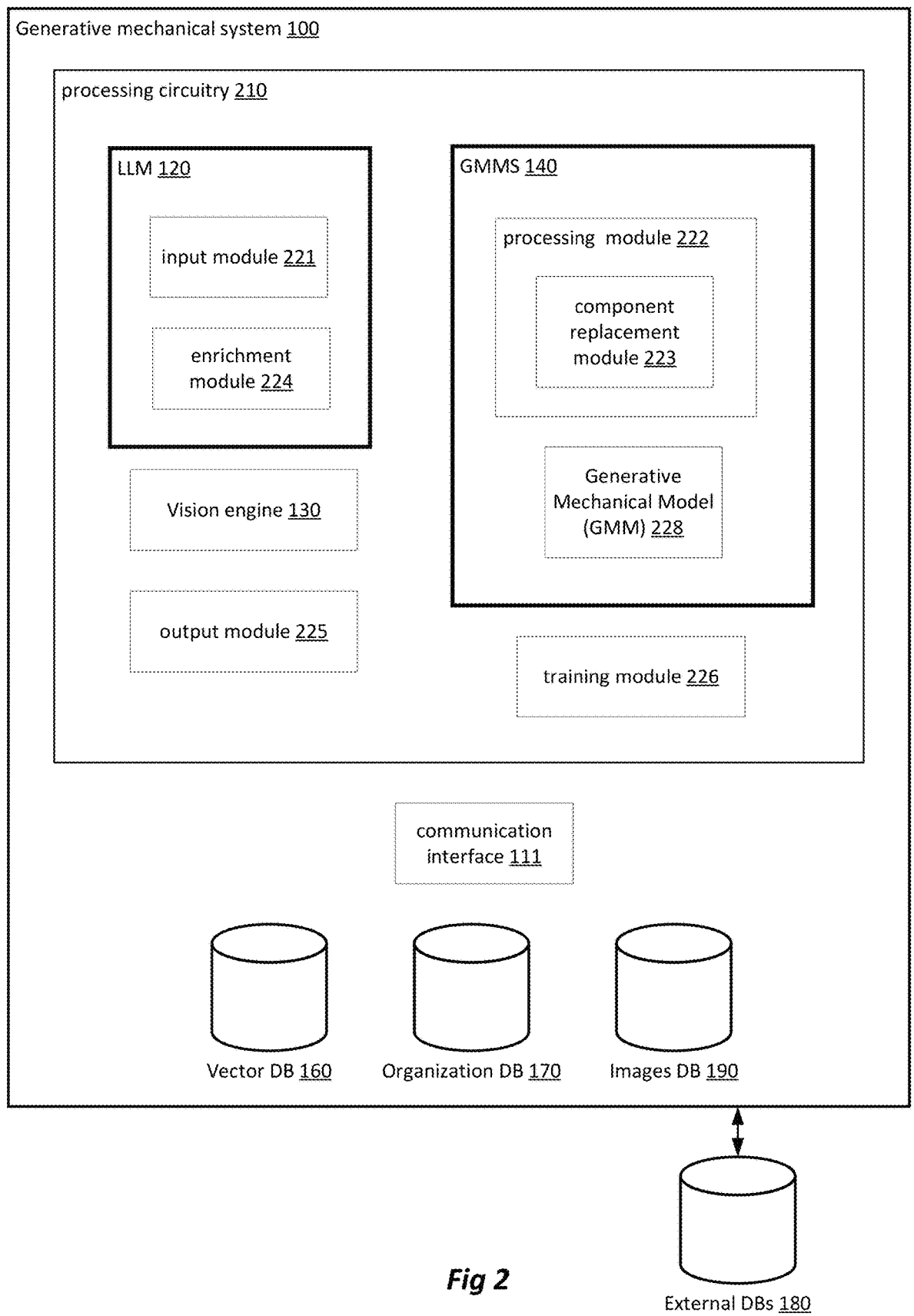
FIG. 2 illustrates a functional block diagram of generative mechanical system 100, in accordance with certain embodiments of the presently disclosed subject matter.

Bearing this in mind, attention is drawn to FIG. 2 illustrating a functional block diagram of the generative mechanical system 100, in accordance with certain embodiments of the presently disclosed subject matter.

System 100 can include a processing circuitry 210 and is configured to provide processing necessary for operating the system 100, as further detailed with reference to FIGS. 2-4. The processing circuitry 210 can comprise one or more processors (not shown separately) and one or more memories (not shown separately). The one or more processors of the processing circuitry 210 can be configured to, either separately or in any appropriate combination, execute several functional modules in accordance with computer-readable instructions implemented on a non-transitory computer-readable memory comprised in the processing circuitry. Such functional modules, referred to hereinafter as comprised in the processing circuitry, may be realized by software stored in memory and executed by the one or more processors. Notably, the term processing circuitry, which is used for brevity, is intended to include both a single processing circuitry as well as a plurality of processing circuitries.

The processing circuitry can comprise the LLM 120, the vision engine 130 and the GMMS 140. The system 100 can also comprise one or more of the databases 160, 170, 190, and part of 180. These DBs can be consolidated or divided differently; the databases can be shared with other systems or can be provided by other systems, including third-party equipment. Specifically, the DBs can be stored external to the system 100, and the system 100 can communicate with these storages, e.g. using communication interface 111.

The processing circuitry 210 can implement the LLM 120 comprising an input module 221, an enrichment module 224, and a plurality of LLMs and Deep Learning Models (DLMs) (not shown). The processing circuitry 210 can further implement the vision engine 130, an output module 225, a training module 226, and the generative mechanical model system (GMMS) 140. The GMMS can implement a processing module 222 comprising a component replacement module 223 and a Generative Mechanical Model (GMM) 228 comprising one or more trained AI models.

During inference stage, an input may be provided by a user through e.g. a web-application, a web browser extension, or an automated assistant integrated within CAD platforms, each configured to operatively communicate with the communication interface 111. The input module 221 is configured to receive the input, comprising requirements for a new design, e.g. through the communication interface 111. Alternatively, the input module 221 is configured to obtain input data, during the training stage, where the input data comprises at least requirements for a new design, and, optionally, comprises engineering requirements.

The LLM 120 is configured to preprocess the input including enriching the input, e.g. using enrichment module 224, and to generate the spec 122 comprising the working plan. The vision engine 130 is configured to receive the spec 122 and to generate corresponding visual representations. The GMMS 140, using the processing module 222, is configured to receive the spec 122 and the meshes from the vision engine 130, and is configured to process the input to generate a CAD design and output it, e.g., using output module 225. The component replacement module 223 is configured to replace, during generation, ideal components with existing components. The training module 226 is configured to train the GMMS 140 to interpret the input data and generate a corresponding CAD design.

The vector DB 160 can store a plurality of vectors. Each vector represents a known component used in designs, for example standard components which can be purchased or produced upon demand. The components can be basic parts, such as screws or wheels, or can be known assemblies such as a handle which may be comprised of several components. The vector DB 160 can also store vectors representing components which are ordinarily used in a particular organization. In some examples, targeted organization-specific data may be processed, e.g. in an indexing process, to create high dimensional representation vectors of the data. These organization-specific data vectors can be added to the vector DB 160 and may continuously be updated, such that at least one of the vectors stored in the Vector DB 160 represents a known component obtained from targeted organization-specific data. In some examples, the vectors stored in the Vector DB 160 correspond to only a subset of all existing known components or those used by organization. The data stored in Vector DB 160 can continuously be updated to include or remove vectors representing known components.

The organization DB 170 can store any data pertaining to an organization, including, but not only, an organization's Product Lifecycle Management (PLM) system, CAD data stored within the PLM system, and organization's documents. The data stored in organization DB 170 can be used to enrich an input received comprising requirements for a new design, e.g. by the LLM 120 or to enrich the Vector DB 160 as part of the indexing process.

The External DBs 180 can be any external DB used during training or inference stages, including the web, where copies of part of the data can be stored in system 100, while other parts are accessible.

The image DBs can store a plurality of images of various components and may be used by the vision engine 130 e.g. during training or inference stages.

The LLM 120 may store a plurality of LLMs and DLMs, each configured to process different input modalities. Some non-limiting examples of LLM 120 include models trained on textual descriptions, sketches, 2D illustration images, and technical specifications.

It should be noted that elements in FIGS. 1 and 2 can be made up of any combination of software and hardware and/or firmware that performs the functions as defined and explained herein. Elements in FIGS. 1 and 2 may be centralized in one location or dispersed over more than one location. For example, each one of elements, such as 226, can be located at a different geographical location, remote from the other elements. Furthermore, in some examples of the presently disclosed subject matter, the system 100 may comprise fewer, more, and/or different elements than those shown in FIGS. 1 and 2. For example, element 222 show several separate elements, each dedicated for executing certain functions of the system, however it will be clear to any person skilled in the art that the functionalities of the system can be otherwise divided. For instance, in an alternative system-design, different functions assigned to input module 221 can be otherwise implemented by the processing module 222. Likewise, various elements described as distributed over different computers, can be otherwise consolidated into a single computer device. Elements, including training module 226, configured for training components of the system 100, such as the LLM 120, the vision engine 130, or the GMMS 140, can be part of a separate system configured for training the system 100.

Figure 3:
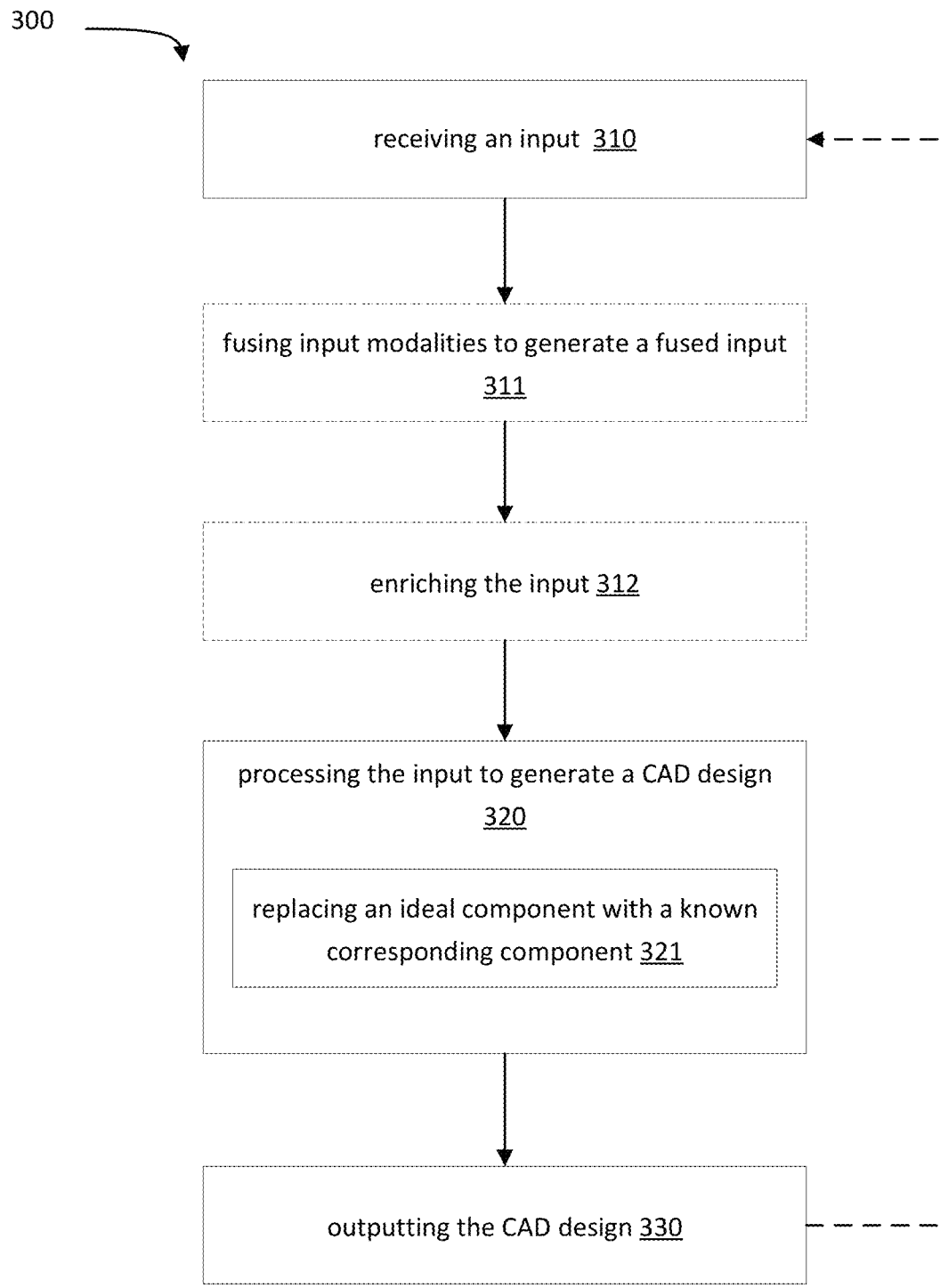
FIG. 3 illustrates a generalized flowchart of operations performed by the generative mechanical system 100 during inference stage, in accordance with certain embodiments of the presently disclosed subject matter.

Referring to FIG. 3, there is illustrated a generalized flowchart 300 of operations performed by the generative mechanical system 100 during the inference process, by a trained AI model, in accordance with certain embodiments of the presently disclosed subject matter. The following flowchart operations are described with reference to elements of the system 100. However, this is by no means binding, and the operations can be performed by elements other than those described herein.

A user who wishes to generate a 3D Computer-Aided Design (CAD), can input a request including requirements for a new design. The user can input the request through, for example, a web application, a CAD software extension, or an automated assistant integrated within a design platform. Each of such platforms operatively communicates with the communication interface 111, which transmits the request to the system 100, configured to implement a method for generating a 3D Computer-Aided Design (CAD). In some cases, the processing circuitry 210 in the system 100 can receive the input comprising the requirements for a new design, e.g. using input module 221 (block 310).

The input can include engineering requirements pertaining to the required design, and can be comprised of a series of requirements and questions pertaining to the required design. In some examples, the input can include a plurality of input modalities, such as a textual description, a sketch, a CAD design, a 2D illustration image, and a technical specification. The textual description input modality can include free text, which allows the user to describe the desired design in natural language. This can include general requirements, specific features, functional descriptions, constraints, and any other relevant details. For example, a user who wishes to design a racing car might specify that the design should be lightweight, highly visually designed, and capable of reaching high speeds. Another input modality is a sketch, where the user can provide a hand-drawn or digital illustration of the desired design. This visual representation helps to convey the overall shape, form, and key design elements of the product, as the user considers to be appropriate. In some examples, the input can also include a CAD design, which provides detailed geometric and engineering data about a similar design. This can include dimensions, tolerances, material specifications, and other technical details necessary for manufacturing, and can optionally include a shell CAD model. A 2D illustration image is another modality, which offers a flat visual representation of the design from one or more perspectives. This can be used to highlight specific features or components of the design. Finally, the input can include a technical specification, which is a formal document which can include details of the design requirements, performance criteria, materials, and testing methods. This comprehensive document ensures that all aspects of the design are clearly defined and can be met during the development and manufacturing process. The input can include requirements pertaining to one or more of the modalities.

Turning to the example of a user who wishes to design a new racing car, the input can include free text describing the desired attributes, such as "The racing car should be able to reach a top speed of 300 km/h and should have excellent handling on sharp turns." The input can also include a sketch of the car's exterior design, highlighting its outer shape and sleek lines. Additionally, the user might provide a CAD design of the car's chassis, detailing the structural components and materials to be used. The chassis can be a chassis of another existing racing car. A 2D illustration image could show the car from various angles, emphasizing specific design features like the wheels. The technical specification might outline the performance criteria, such as acceleration, braking distance, and fuel efficiency, as well as the materials and testing standards to be followed. The input can also include some questions such as, "Can the racing car reach a speed of 100 km/h in 3 seconds?"

In some examples, the input comprises a plurality of input modalities. Before processing these modalities, the input module 221, using LLM 120, can fuse them into a fused input (block 311). To achieve this fusion, the input module 221, using LLM 120, can process each input modality. As described with respect to FIG. 1, the LLM 120 can comprise one or more trained LLMs and Deep Learning Models (DLMs) designed to interpret and process each modality separately. Each of the models within the LLM 120 is trained to process the different modality. Each input modality may be injected into a model trained on data of that type, which may also be trained on engineering-related data. For instance, textual inputs are processed by a model trained on textual and engineering data, while image inputs are processed by a model trained on engineering-related images. Similarly, 3D data inputs are processed by a model trained on data including general shapes and CAD models. Each form of input is converted into a respective vector, e.g., using vector embedding techniques. For example, textual descriptions, CAD data, and user requirements are transformed into vectors using Word2Vec for text or specialized methods for CAD features.

In some examples, the models in LLM 120 are further trained to combine different combinations of those inputs, and to understand how to extract information from one domain to another. Hence, the input module 221 can fuse the separate vectors into a single fused vector forming a fused input. This fusion process, using vector techniques, facilitates that the final fused input accurately represents and preserves the integrity and relationships of the original data, while adding information pertaining to extracting information from one domain into the other.

The fused input of the LLM 120 can be converted back into text, using vector techniques, generating a single, cohesive specification, referred to as the spec 122, representing a working plan including technical instructions based on the input or the fused input.

It should be noted that in cases where the input includes just one modality, the input module 221 can also process the input, using the LLM 120, to generate an output in the form of the spec 122. In such cases, the trained LLM 120 can interpret the input to generate technical instructions based on the input, while optionally enriching it, as described below.

Receiving a plurality of modalities and fusing them into a single fused input is advantageous, as the system 100 is capable of handling different modalities and is trained and designed to integrate and process these diverse types of input data. This fusion process is particularly beneficial because it involves understanding how to extract information from one domain (modality) and apply it to another domain. By fusing different combinations of the inputs, the system 100 can create a more comprehensive and cohesive specification that leverages the strengths of the combination of the modalities.

In some examples, the input module LLM 120 can enrich the input with targeted organization-specific data (block 312), such as stored in Organization DB 170. The targeted organization-specific data can be sourced from various internal documents of the organization including the Product Lifecycle Management (PLM) system, CAD data stored within the PLM system, and other documents of the organization. The PLM system typically contains extensive information about past and current product designs, including CAD data stored within the PLM system and other related documents of the organization. Integration of such information with the input is advantageous, as it helps make the enriched input more comprehensive and aligned with the organization's standards and practices.

For instance, when a user inputs requirements for a new design, the input module 221 can access the PLM system in Organization DB 170 to retrieve relevant CAD data and documents. This data is then integrated into the input, e.g. in a similar manner to fusing of various inputs, ensuring that the eventual generated CAD design is not only based on the user's specifications, but also aligned with the organization's established standard and best practices. The data in the organization DB 170 may be processed in a preliminary indexing process, as detailed further below, to generate corresponding vectors from the stored data, enabling to perform required vectors manipulation. The generated CAD designs, based at least partially on data stored in the organization DB 170, are thus more suitable for practical application within the particular organization.

The spec 122 can be transmitted to the GMMS 140 to generate the CAD design. In addition to transmitting the spec 122 to the GMMS 140, the spec 122 can be transmitted to the vision engine 130.

The vision engine 130 can process the spec 122 by analysing existing images of relevant components stored in images DB 190 or accessible on the web, and generating the 2D & 3D meshes 132 illustrated FIG. 1, including one or more visual representations of the design, based on the spec 122. To generate the meshes 132, the vision engine 130 may use a diffusion model trained on a large dataset of images, including 3D models and actual photographs of various engineering components, to produce high-level 2D and 3D meshes that depict how specific components would look. Several versions of a visual design of a component may be generated to show different design possibilities. The meshes 132 may include three-dimensional shapes composed of interconnected triangles forming the surface of the required component. These meshes are not detailed assemblies, but rather shell models, which may later be refined, together with the spec 122, by the GMMS 140, into detailed CAD design.

After the vision engine 130 outputs meshes 132, it may transmit them to the GMMS 140. The processing module 222 in GMMS 140 can receive the spec 122 from the LLM 120, receive the meshes 132 from the vision engine 130, and may process the received data to generate a CAD design, using a trained AI model (block 320), such as the GMM 228. The generated CAD design may include at least two separate components. In some examples, a component can be an assembly or a part. In some examples, the generated CAD design comprises at least one known component. Known components can be obtained e.g. from vector DB 160, organization DB 170, or from other external DBs 180 such as the web.

In order to use known components when generating a CAD, the component replacement module 223 can search for replacement for components that were determined to be ideal. To illustrate the process, the component replacement module 223 can, during generation of the next component, generate an ideal component to be comprised in the design. Generation of the ideal component can be done by generating an embedding vector corresponding to the ideal component. The component replacement module 223 can then access a vector database such as vector DB 160 storing a plurality of vectors. As described above, each of the vectors in the vector DB 160 represents a known component used in designs. The component replacement module 223 can search the Vector DB 160 to identify a matching vector that aligns with the embedding vector, e.g. using vector matching techniques. Once one or more matching vectors are identified, the component replacement module 223 can retrieve the known component associated with that vector. The corresponding known component can be found in e.g. the organization DB 170, or from an external DBs 180, or any other DB which has a connection between the embedding and the known component. The retrieved known component may be used in the continuous generation such that the next generated component can fit the retrieved component. As the retrieved components used as a constrain to the next generation, instead of just generating the corresponding embedding vector without constraints, the next generated components fit and are integrated with the retrieved component.

Finally, the CAD design can be generated using the retrieved known component. By leveraging these steps, the method ensures efficient and accurate assembly of CAD designs, incorporating both novel and familiar components. In some examples, the generated CAD design uses known components used in a particular organization. As such, the vector DB 160 may store at least one vector representing known components obtained from targeted organization-specific data.

During the generation process, iterations with the user can be conducted to refine and improve the design. This process may include a series of questions and responses regarding the required design. The user may initiate questions about the design, and the system 100, using the LLM 120 and/or the trained GMMS 140, can provide responses. Additionally, the GMMS 140 or the LLM 120, is trained to identify when additional information is needed to complete partial engineering requirements provided by the user in order to generate the CAD design. The LLM 120 may communicate with user, e.g. using the communication interface. However, in some cases, the trigger to making a request for additional information can be sourced in the GMMS 140. For example, the GMMS 140 can understand the mechanical assembly, and can use it as input to the LLM 120 in order to understand the current design and what critical information is needed to achieve the best design. For example, the GMMS 140 can be very sensitive to the manufacturing method for a specific part which could be translated into a question to the user-what manufacturing method would you like to use.

Based on the input, the GMMS 140 determines the pre-trained engineering requirements necessary for a particular design. If there are gaps and any of these requirements are missing from the input, the GMMS 140 can request additional information. In some examples, the input may be enriched based on the user's questions, the system's responses, and the user's responses to the requests for additional information. Enriching the input can be done in a similar manner to fusing the input modalities, such that the input is fused with the embedding generated based on the responses or the questions. The enriched input can then be processed to generate the CAD design.

This iterative approach is advantageous, as it facilitates generation of a design that evolves in accordance with specific requirements and feedback, leading to a more accurate and tailored final design. For example, if the initial design of a racing car requires basic information including number of seats and maximum speed, or if the specification provided for the engine is missing the required material preference which may be crucial to the performance of the racing car, then the GMMS 140, or at an earlier stage the LLM 120 can prompt the user for more details, such as material preferences or performance criteria, and incorporate this information into the design.

After the generation, the output module 225 can output the CAD design (block 330). In some examples, since the system 100 components, in particular, the GMMS 140, are trained on engineering documentation, then the outputted CAD design is compliant with Design for Manufacturing and Automation (DFMA) standards. Ensuring compliance with DFMA standards is advantageous for creating designs that are not only feasible for manufacturing and assembly components, but also optimized. Usage of known components, optionally, from targeted organization-specific data, helps in reducing manufacturing costs, simplifying the assembly process, and improving product quality by designing parts and assemblies that are easy to manufacture and assemble, and that are accessible to the user operating in the organization.

In some examples, the outputted CAD design includes technical specifications of the CAD design, or at least one subcomponent of the CAD design. A subcomponent can be a part or a sub-assembly, or that is part of the overall design. The technical speciation can include portions of the spec 122 used as an input to the GMMS 140. Alternatively, a technical speciation can be generated, e.g. by the LLM 120, when the generated design is input to it, in the same manner as is used for processing CAD designs inputs. These technical specifications provide detailed information about the design, including dimensions, materials, tolerances, and performance criteria. This information is essential for manufacturing the product, conducting quality control checks, and ensuring that the design meets the required standards and performance criteria. Also, providing technical specifications for subcomponents ensures that each part of the design is well-defined and can be manufactured and assembled correctly. This detailed level of specification assists in maintaining consistency and quality throughout the manufacturing process.

The outputted CAD design includes technical specifications of at least one subcomponent of the CAD design. A subcomponent can be a subassembly or a subpart that is part of the overall design. Providing technical specifications for subcomponents ensures that each part of the design is well-defined and can be manufactured and assembled correctly. This detailed level of specification may assist in identifying any potential risks or errors in the design, a subcomponent, or a sub-assembly, and has a clear detailing about the requirements and standards to be met with respect to the design.

The outputted CAD design can also comprise at least a blueprint drawing, including at least 2D projections of the CAD design. Alongside the detailed specification, such drawings provide a visual representation of the design from various angles, including isometric views. The blueprint my be generated based on the CAD, and may provide specific information on how to manufacture and assemble the product and parts, including important information on specific dimensions, materials, etc. The drawings also include engineering annotations such as tolerances, materials, and other critical information necessary for manufacturing and quality control. Additionally, the CAD design may include 3D representations to give a more comprehensive view of the design, aiding in better visualization and understanding of the product.

After the initial CAD design is outputted, the system 100 can repeatedly refine and improve the design based on user feedback (marked by a dashed arrow from block 330 to block 310). This iterative process involves receiving requests for changes to the CAD design from the user. These requests can include modifications or additions to the design. The system 100 processes these modification requests to generate a revised CAD design. The revised design is then outputted for user review. Processing the modification requests can be performed similarly to the processing of the initial text input when requirements for the new design are first received. The generated CAD design can then be added as a CAD input, along with the output specification, and the user's requests for modification.

This iterative cycle of receiving requests, at least one request, processing modifications, and outputting revised designs, can be repeated as necessary to ensure the final CAD design meets the user's specifications and requirements. It also enhances the precision and quality of the final product by allowing for continuous refinement by receiving a user's feedback and regenerating a revised CAD design.

Turning now to the description of training models included in the generative mechanical system 100, the training process is grounded in a wide array of engineering data spanning various fields, including mechanical engineering, aerodynamics, physics, and material science such as chemistry, or material engineering. By leveraging this extensive dataset, the system 100 is capable of generating designs that are not only theoretically sound, but also practical for real-world manufacturing. This ensures that the CAD models produced by the system adhere to industry standards and can be effectively brought to production.

Also, by training the system on a diverse dataset that includes various assemblies and parts, and by using masking techniques, as detailed further below, the generated CAD models are capable of representing complex mechanical relationships and functional dependencies between components of designs. One of the advantages in generating CAD designs using the system 100 is the ability to generate CAD models forming an assembly of two components or more, where a component can be either an assembly by itself, or a part. The assembly component can be a known assembly, such that is used in industry or in an organization, or one that was already generated in a previous generation, and now can be used for a new design. This feature allows for the creation of detailed and complex designs, while not only improving the accuracy and practicality of the designs, but also ensures that the generated designs are manufacturable and adhere to industry standards.

Moreover, training the system to use known parts as reference points, and optionally replacing ideal components, parts or assemblies generated by the system 100, with known existing equivalents, further enhances the system's ability to produce viable and manufacturable designs, adding a foundation of reliability and accuracy to the generated outputs. This comprehensive training approach significantly enhances the system's capability to handle complex design requirements and produce high-quality, manufacturable CAD models.

Figure 4:
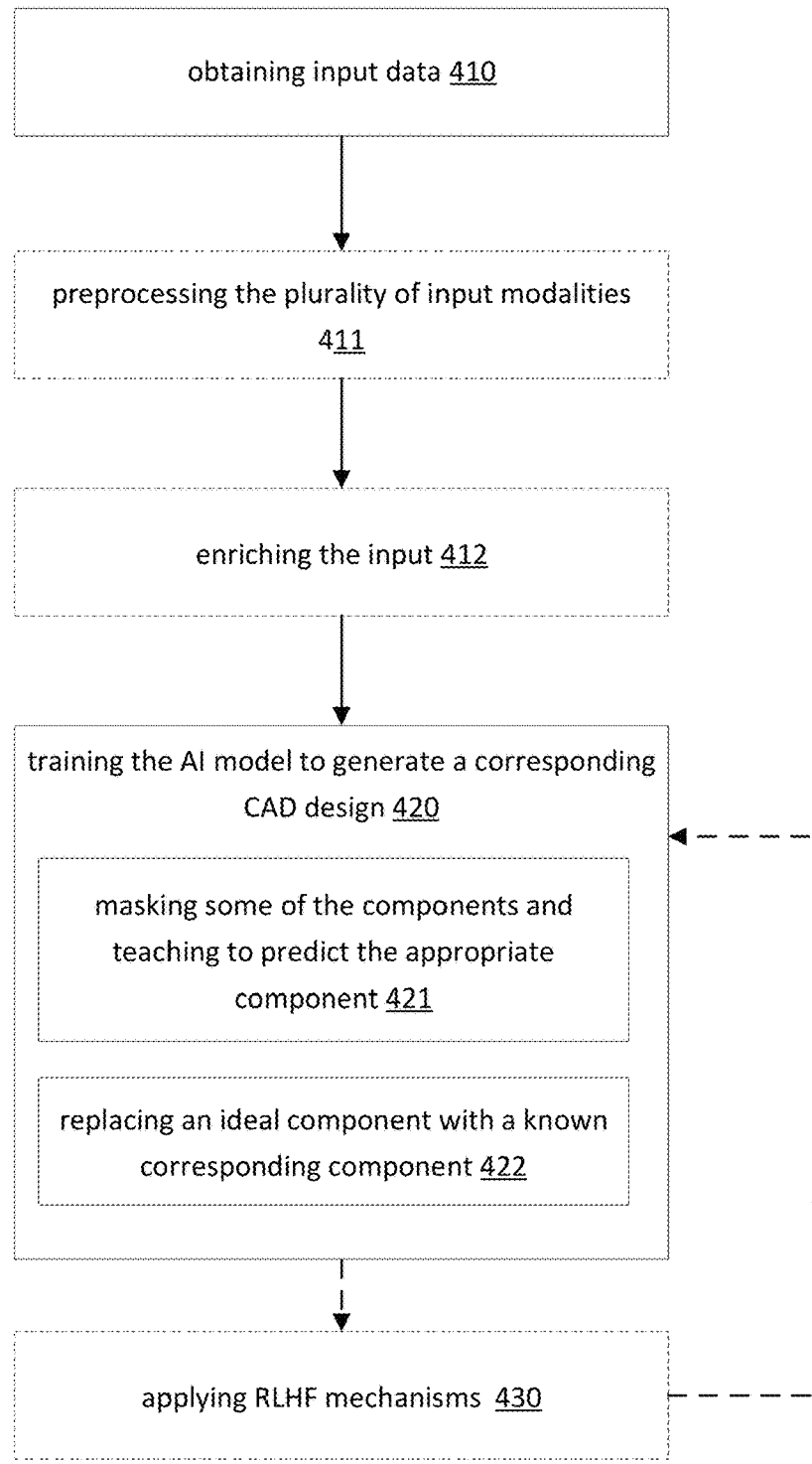
FIG. 4 illustrates a generalized flowchart of training components in the generative mechanical system 100, in accordance with certain embodiments of the presently disclosed subject matter.

Bearing this in mind, attention is drawn to FIG. 4, illustrating a generalized flowchart 400 of training components in the generative mechanical system 100, in accordance with certain embodiments of the presently disclosed subject matter. The following flowchart operations are described with reference to elements of the system 100. However, this is by no means binding, and the operations can be performed by elements other than those described herein.

Provided in FIG. 4 is a method for training an artificial intelligence (AI) model to generate a 3D Computer-Aided Design (CAD) involving a process of obtaining input data that includes at least the requirements for a new design (block 410). This input data is used to train the AI model to interpret the design requirements and generate a corresponding CAD design (block 420). The resulting CAD design is structured as an assembly of at least two separate components, ensuring that the model can handle complex designs composed of multiple parts, integrated with each other.

Several components in the system 100 are trained or used for preprocessing the input prior to the training, including the LLM 120, the vision engine 130, and the GMMS 140, e.g. using training module 226 included in the system 100. The training input data received and processed includes requirements for a new design, and, optionally, engineering requirements.

The input data can comprise various modalities, including, in some examples, at least an input modality of a CAD design and requirements pertaining to the CAD design. Optionally, additional modalities such as textual descriptions, sketches, 2D illustration images, and technical specifications, are provided. Textual descriptions can include free text, whereas technical specifications may include engineering specifications, sketches, a CAD design, or a 2D illustration image.

The one or more LLMs and Deep Learning Models (DLMs) included in the LLM 120 are designed to interpret and process each modality separately, converting them into corresponding text outputs. Each of the models in the LLM 120 is trained on a vast amount of data sources, including images, text, and 3D CAD data, and is trained to interpret each modality to understand engineering requirements from the data included in the particular input modality. The models may first be trained on data of a particular modality, and then fine-tuned on data of technical books from the domain of mechanical engineering in that particular modality. For example, a textual model configured to interpret textual input, may be trained on textual words, and later fine-tuned on technical books from the domain of mechanical engineering. A model configured to interpret an image, including sketches input, may be trained on images, and later fine-tuned on mechanical engineering-related images. A model configured to interpret 3D data input may be trained on general shapes and further trained on millions of CAD models.

Prior to training, the input data comprises various modalities, and can undergo preprocessing using the models in the LLM 120 (block 411). This preprocessing involves interpreting each input with a respective model, and generating a corresponding embedding vector using vector embedding techniques. These techniques maintain the original context and relationships of the input data, in particular for each input provided in each modality separately. The LLM 120 may also be trained to extract information from one input modality and apply it to another. This can be achieved by training the LLM 120 on pairs or combinations of different modalities. Additionally, the model can be trained to understand the mechanical relationships between different parts and subassemblies within the design. This may be performed using a combination of training data that includes textual instructions, 3D CAD data, and corresponding 2D images. By learning these associations, the LLM 120 can learn the mechanical relationships between the components, so later, a coherent and accurate CAD designs are produced by the GMMS based on the combination of various modalities.

For example, the LLM 120 may be provided with textual instructions, including product requirements or specifications, together with corresponding 3D CAD data. The LLM 120 can then learn how to interpret the 3D CAD data to generate corresponding product requirements. Another example includes providing the LLM 120 with both standard 2D images and the corresponding 3D CAD data, training the LLM 120 to interpret 2D images, and corresponding spec. In order to train the LLM on combinations of input, in some examples, one of the input can be masked such that the training is performed on the remaining input modalities. This training is advantageous, as it achieves the ability to interpret one modality and complete corresponding requirements, and later to fuse various modalities of input, while maintaining the characteristics of each modality and the relationships between them.

Following the preprocessing of the various modalities, and training on combination of the modalities, the input may be fused into a single input referred to as the spec 122, forming a unified input which reflects a cohesive and linked representation of the input data. As mentioned above, the spec 122 represents a working plan including technical instructions based on the input. In some examples, prior to generating the spec 122, the enrichment module 224 may be trained to enrich an input data (block 412), e.g. with targeted organization-specific data, for example, stored in organization DB 170. The enrichment during the inference stage, involves modifying the input, or associating it with additional data that is specific to the organization and ensures that the generated CAD designs are tailored to meet the unique standards, requirements, and best practices of a particular organization. The enrichment module 224 may be trained to retrieve organization data, and fuse it with the input. As such, the LLM 120, including the enrichment module 224, may be trained to retrieve organization data, process it by the input module 221 to generate a corresponding embedding, and then fuse it with the input by fusing embeddings techniques, e.g., in a similar manner to that performed on two textual inputs provided to the LLM 120 as described above.

The organization data that can be used may include data from the organization's Product Lifecycle Management (PLM) system. The PLM system typically contains extensive information on past and current product designs, including CAD data stored within the system and other related documents. By training the LLM 120 to access and incorporate this data, the system 100 can improve the input data, ensuring that the enriched input is comprehensive and aligned with the organization's established standards and practices.

The organization data can also include the organization's inventory. This can include information on available materials, components, and parts that are regularly used or in stock within the organization. During the inference stage, using of the organization's inventory as a source for generating components can optimize the design process to utilize existing resources efficiently, reduce costs, and streamline the procurement and manufacturing phases. This ensures that the generated CAD designs are not only aligned with the organization's practices, but are also feasible and practical, given the available resources.

In some examples, the AI model is trained to identify gaps or missing information in the initial input, based on pre-trained engineering requirements. When such gaps are detected, the model can automatically generate requests for additional information from the user. This may include specific details about material preferences, performance criteria, or any other relevant specifications that were not fully addressed in the initial input. Training to identify gaps or missing information can be done by training the AI model and optionally the LLM 120, based on the vast technical engineering data the models were trained on, and also by removing part of the information and training the models to complete potential inputs. Additionally, the model is trained to handle user-initiated questions. During the design process, users might have specific queries or provide new insights that need to be incorporated into the design. The AI model learns to process these inputs, e.g. using the LLM 120 as an additional input which should be fused with other inputs, and adjust the spec 122 accordingly, to generate a more detailed and accurate CAD design.

During the inference stage, the generated spec 122 may be used by the vision engine 130 to generate visual representations. Training the vision engine 130 to generate high-level 2D & 3D meshes, referred to as meshes 132, may be done in a manner similar to training the LLM 120 to interpret engineering requirements. Just as the LLM 120 is trained to interpret instructions and CAD designs or 2D/3D images, the vision engine 130 is trained to convert these instructions and CAD designs into visual representations. This involves training the vision engine on pairs of textual instructions and corresponding visual outputs, allowing it to learn how to generate accurate visual illustrations designs from the given specifications.

The training process of the GMM 228 comprising the AI model, for generating CAD designs based on the spec 122 and the meshes 132, involves several steps. In some examples, the working plan in spec 122 includes a proposed assembly tree comprising a bill of materials (BOM) hierarchy or product structure, representing a proposed hierarchical representation of a design's components and subassemblies. The spec 122 may include data on how individual parts and subassemblies come together to form the final design, and the order in which these components should be generated.

The assembly tree may be for a structure of hierarchical layers, starting with the top-level product (design) and branching out to show all sub-assemblies and individual parts. Such an hierarchical structure is advantageous for understanding the relationships and dependencies between different parts and sub-assemblies within the design. Instructions for generating the design are embedded with the assembly tree by providing relevant information for each layer in the tree. The instructions for generation may start with the larger parts, generating them first, and then move down to the next layer, which include components dependent on the previous layer. The final layer includes individual parts or assemblies of individual parts. This structured approach ensures that the generated CAD designs are comprehensive and practically feasible for manufacturing. As described further below, by leveraging also known assemblies or parts, the model can efficiently generate detailed and accurate designs without the need to repeatedly drill down into individual parts. This layered, iterative training process results in reliable, manufacturable CAD designs that meet the specified requirements.

Based on the spec 122, which includes the assembly tree and proposed sequential order of generation of components, the AI model may execute an iterative sequential generative model. The model is trained to generate components in a step-by-step manner, where each step depends on the previous steps. In each iteration, a specific component is generated and then used as input for the next stage, effectively building an assembly tree of components. The component which is generated may be the next component in the sequence, based on the current state of the design. In some examples, the proposed sequential order may indicate starting with larger, more foundational components, such as the chassis in the racing car design example, and then proceeding to generate dependent components in subsequent iterations. In this manner, the AI model is also trained to identify and model the engineering constraints between the different components. However, those versed in the art would realize that another sequence of generation of components may be determined.

Training a sequential generative model based on an assembly tree and the proposed sequential order is advantageous for generating complex designs comprising at least two components. The structure and dependencies between components need to be meticulously considered in order to generate a design that is feasible for production. Also, generating the components in the proposed order, typically beginning with larger or more restrictive components, followed by smaller or dependent components, facilitates an efficient and practical design.

The GMM 140 is trained to execute iterative sequential generation. In each iteration, a certain component is generated, which is then used as input for the next stage, where the next component is generated. The sequence of generation is determined by the assembly tree and the proposed order, such as starting with larger or basic components of the design, and then proceeding to smaller components or those dependent on other components. For example, in the racing car design, the AI model is trained to generate the chassis and engine first, followed by generating the smaller outer parts.

Such generation is described as a sequential generation, however those versed in the art will realize that at least some of the components, which are independent of each other, may be generated simultaneously and may be provided as separate inputs to the next layer of generation. Moreover, in some examples even dependent components can be generated simultaneously, when they are generated one step after another, while monitoring and progressing the generation of components. As the generation progresses the system monitors that the required conditions and the constrains continued to be fulfilled and continues the generation as long as the conditions are met.

To train the AI model to understand the connections and constrains between components within the assembly tree, various techniques may be employed. One such technique includes masking certain parts or sub-assemblies during training, and teaching the model to predict the appropriate part to place in the masked position (block 422), and optionally, the localization of the generated component as well. The masking helps the model learn to consider other CAD models, including those provided in the input data, and to understand the mechanical relationships between different parts and sub-assemblies within an assembly. This method ensures that the AI model can take into consideration the interactions and dependencies between components.

In some examples, the AI model is trained to generate a CAD design comprising at least one known component. Using known components is advantageous for ensuring that the generated designs are practical and manufacturable. This training step involves familiarizing the AI model with a database of existing components, allowing it to identify and integrate these components into new designs.

In some examples, for a given component the AI model is trained to generate an embedding vector that represents an ideal component for inclusion in the CAD design. This vector captures the essential characteristics and specifications of the component in a high-dimensional space. Once the embedding vector is generated, the system 100 is trained to access a vector database, such as Vector DB 160, storing a collection of vectors, each representing a known component used in various designs. The system 100 is trained to search the Vector DB 160 to find a matching vector, that closely corresponds to the generated embedding vector. This search process involves comparing the generated vector with the stored vectors to identify the best match, e.g. using known vectors techniques.

Upon identifying a matching vector, the system 100 is trained to retrieve any known component associated with this vector from the database, e.g. the organization DB, or an external DB. This component is then integrated into the CAD design, while replacing the ideal components with the known corresponding components (block 422), ensuring that the final design includes standardized, reliable components, e.g. such that were previously tested and validated. It should be noted that the corresponding vector may not be identical to the ideal one, but could form a certain variation of the ideal component, yet meet the required needs. The retrieved components may then be used in the next generation of the next components. During training, the system may not retrieve any matching vector or component, but is trained to search for one during inference stage.

As mentioned above, the vector DB 160 can include vectors representing components obtained from targeted organization-specific data. Hence, the training process can be customized to include components that are specific to an organization, including standard but also proprietary parts or components commonly used in the organization's products. By incorporating these organization-specific components into the training process, the AI model is better equipped to generate CAD designs that are tailored to the organization's standards and requirements.

In some examples Reinforcement Learning with Human Feedback (RLHF) mechanisms may be applied to refine the AI-generated CAD designs. Hence, during training, iterative feedback loops are provided by human experts who review and evaluate the generated designs, providing specific feedback on various parameters such as design complexity, adherence to requirements, and compliance with Design for Manufacturing and Assembly (DFMA) standards.

The RLHF process begins by generating an initial CAD design using the trained AI model. This design is then reviewed by human experts who assess it based on predefined criteria. For instance, they might evaluate how well the design meets the specified engineering requirements, whether it adheres to industry standards, or if it includes any unnecessary complexities that could hinder manufacturing or functionality. Based on the feedback received, the AI model may be adjusted and retrained. This feedback loop may continue until the AI model consistently produces high-quality designs that meet all necessary criteria (indicated by a dashed arrow from block 430 to block 420). The iterative nature of RLHF allows the AI model to learn from feedback and improve over time, even during inference stage.

Hence, training the AI model to generate CAD designs that comply with Design for Manufacturing and Automation (DFMA) standards may be done by enriching the input with DFMA standards and fuse the input with the standards, as described above, but also by the RLHF process. This facilitates training the AI model to generate corresponding CAD designs that are compliant with the DFMA standards.

Moreover, the AI model may be trained to output detailed technical specifications of the generated CAD designs, including e.g., subcomponents of the CAD design. The technical specification may include comprehensive information on dimensions, materials, tolerances, and other critical parameters The required material selection may also be a part of the specification process. Outputting technical specifications can be achieved e.g., by providing the generated CAD to the LLM 120 which is trained to generate corresponding technical specifications in a similar manner to that described above upon receipt of a CAD input.

It is noted that the teachings of the presently disclosed subject matter are not bound by the flow charts illustrated in FIGS. 3 and 4, and that the illustrated operations can occur out of the illustrated order. For example, operations <311> and <312> or <411> and <412> or <421> and <422>, shown in succession, can be executed substantially concurrently, or in the reverse order. Also, in various examples of the presently disclosed subject matter, fewer, more, and/or different stages than those shown in FIGS. 3 and 4 may be executed.

It is to be understood that the invention is not limited in its application to the details set forth in the description contained herein or illustrated in the drawings. The invention is capable of other embodiments and of being practiced and carried out in various ways. Hence, it is to be understood that the phraseology and terminology employed herein are for the purpose of description and should not be regarded as limiting. As such, those skilled in the art will appreciate that the concept upon which this disclosure is based may readily be utilized as a basis for designing other structures, methods, and systems for carrying out the several purposes of the presently disclosed subject matter.

It will also be understood that the system according to the invention may be, at least partly, implemented on a suitably programmed computer. Likewise, the invention contemplates a computer program being readable by a computer for executing the method of the invention. The invention further contemplates a non-transitory computer-readable memory tangibly embodying a program of instructions executable by the computer for executing the method of the invention.

Those skilled in the art will readily appreciate that various modifications and changes can be applied to the embodiments of the invention as hereinbefore described without departing from its scope, defined by the appended claims.

The invention claimed is:

1. A computerized method for training an artificial intelligence (AI) model to generate a 3D Computer-Aided Design (CAD), the method comprising:
   obtaining input data comprising at least requirements for a new design; and
   training the AI model to interpret the input data and generate a corresponding CAD design, wherein the CAD design is an assembly of at least two separate components,
   wherein training the AI model further comprises training the AI model to generate a CAD design comprising at least one known component;
   wherein training the AI model further comprises training the AI model to:
      generate an embedding vector corresponding to an ideal component to be included in the CAD design;
      access a vector database storing a plurality of vectors, wherein each vector represents a known component used in designs;
      search the vector database to identify a matching vector to the embedding vector;
      retrieve a known component corresponding to the matching vectors; and
      generate the CAD design using the retrieved known component; and wherein training the AI model further comprises training the AI model to identify and model engineering constraints between the different components by masking some of the components during training and teaching the AI model to predict an appropriate component to place in the masked position.

2. The method of claim 1, wherein each of the components is selected from a sub-assembly and a part.

3. The method of claim 1, wherein the input comprises a plurality of input modalities, wherein the method further comprises:
prior to training the AI model, preprocessing the plurality of input modalities, using at least a Large Language Model (LLM), by:
generating embedding vectors for each of the modalities using vector embedding techniques; and
fusing the embedding vectors in various combinations of the modalities to create linked representations of the input data modalities; and
training the AI model to interpret the input data and the generated combination.

4. The method of claim 3, wherein each of the input modalities is selected from a group comprising: a CAD design and requirements pertaining to the CAD design, a textual description, a sketch, a 2D illustration image, and a technical specification.

5. The method of claim 1, further comprising enriching the input data with targeted organization-specific data.

6. The method of claim 1, wherein enriching the input comprises integrating data from the organization's Product Lifecycle Management (PLM) system, including CAD data stored within the PLM system and the organization's documents.

7. The method of claim 1, further comprising training the AI model to:
enrich the input based on at least responses to requests for additional information based on pre-trained engineering requirements or data based on responses to user-initiated questions; and
process the enriched input to generate the CAD design.

8. The method of claim 1, wherein the AI model is trained to generate a corresponding CAD design compliant with Design for Manufacturing and Automation (DFMA) standards.

9. The method of claim 1, wherein the AI model is trained to output technical specification of the outputted CAD design.

10. A computer system for training an artificial intelligence (AI) model to generate a 3D Computer-Aided Design (CAD), the system comprising a processing circuitry being configured to:
obtain input data comprising at least requirements for a new design; and
train the AI model to interpret the input data and generate a corresponding CAD design, wherein the CAD design is an assembly of at least two separate components,
wherein training the AI model further comprises training the AI model to generate a CAD design comprising at least one known component;
wherein training the AI model further comprises training the AI model to:
generate an embedding vector corresponding to an ideal component to be included in the CAD design;
access a vector database storing a plurality of vectors, wherein each vector represents a known component used in designs;
search the vector database to identify a matching vector to the embedding vector;
retrieve a known component corresponding to the matching vectors; and
generate the CAD design using the retrieved known component; and
wherein the processing circuitry being configured to train the AI model to identify and model engineering constraints between the different components by masking some of the components during training and teaching the AI model to predict an appropriate component to place in the masked position.

11. A non-transitory computer readable storage medium tangibly embodying a program of instructions that, when executed by a computer, cause the computer to perform a computerized method for training an artificial intelligence (AI) model to generate a 3D Computer-Aided Design (CAD), the method comprising:
obtaining input data comprising at least requirements for a new design; and training the AI model to interpret the input data and generate a corresponding CAD design, wherein the CAD design is an assembly of at least two separate components,
wherein training the AI model further comprises training the AI model to generate a CAD design comprising at least one known component;
wherein training the AI model further comprises training the AI model to:
generate an embedding vector corresponding to an ideal component to be included in the CAD design;
access a vector database storing a plurality of vectors, wherein each vector represents a known component used in designs;
search the vector database to identify a matching vector to the embedding vector;
retrieve a known component corresponding to the matching vectors; and
generate the CAD design using the retrieved known component; and
wherein training the AI model further comprises training the AI model to identify and model engineering constraints between the different components by masking some of the components during training and teaching the AI model to predict an appropriate component to place in the masked position.

* * * * *